(12) United States Patent
Grewing et al.

(10) Patent No.: US 7,242,913 B2
(45) Date of Patent: Jul. 10, 2007

(54) CIRCUIT ARRANGEMENT FOR FREQUENCY CONVERSION AND MOBILE RADIO DEVICE WITH THE CIRCUIT ARRANGEMENT

(75) Inventors: Christian Grewing, Sollentuna (SE); André Hanke, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 334 days.

(21) Appl. No.: 10/939,278

(22) Filed: Sep. 10, 2004

(65) Prior Publication Data

US 2005/0090221 A1    Apr. 28, 2005

Related U.S. Application Data

(63) Continuation of application No. PCT/DE03/00345, filed on Feb. 6, 2003.

(30) Foreign Application Priority Data

Mar. 12, 2002   (DE) ................. 102 10 708

(51) Int. Cl.
  *H04B 1/04*    (2006.01)
  *H04B 1/26*    (2006.01)
(52) U.S. Cl. ............ 455/112; 455/118; 455/323
(58) Field of Classification Search ........... 455/112, 455/20, 118, 130, 131, 165.1, 183.1, 216, 455/255, 313, 323
  See application file for complete search history.

(56) References Cited

U.S. PATENT DOCUMENTS

| 3,188,483 | A | 6/1965 | Steiner |
| 3,605,023 | A | 9/1971 | Kline, Jr. |
| 6,282,413 | B1* | 8/2001 | Baltus ............. 455/260 |
| 6,404,244 | B2* | 6/2002 | Flecheux .......... 327/115 |
| 6,529,052 | B2* | 3/2003 | Wang ............... 327/120 |
| 7,030,667 | B2* | 4/2006 | Grewing et al. ... 327/113 |
| 2001/0054919 | A1 | 12/2001 | Wang |

FOREIGN PATENT DOCUMENTS

| DE | 35 33 104 A1 | 4/1987 |
| DE | 197 10 490 A1 | 10/1998 |
| DE | 44 97 767 C2 | 2/1999 |

OTHER PUBLICATIONS

"A Novel Frequency Divider Configuration for Micro- and Millimeter-Wave Signals", P Nüchter and W. Menzel, IEEE Microwave and Guided Wave Letters, vol. 6, No. 7, Jul. 1996, 3 pgs.

* cited by examiner

*Primary Examiner*—Sonny Trinh
(74) *Attorney, Agent, or Firm*—Eschweiler & Associates, LLC

(57) ABSTRACT

The invention is directed to a frequency conversion circuit arrangement a mobile radio containing such circuit which provide frequency conditioning with a frequency mixer. In this context, a feedback path from the output of the frequency mixer to a further input on the frequency mixer is provided which has a frequency divider. Particularly if the frequency divider is in the form of a divide-by-two frequency divider, the frequency conversion circuit exhibits low power and has a small chip area and permits the circuit to be operated without reaction on a frequency generator in order to actuate a frequency converter for a useful signal in a transceiver.

17 Claims, 2 Drawing Sheets

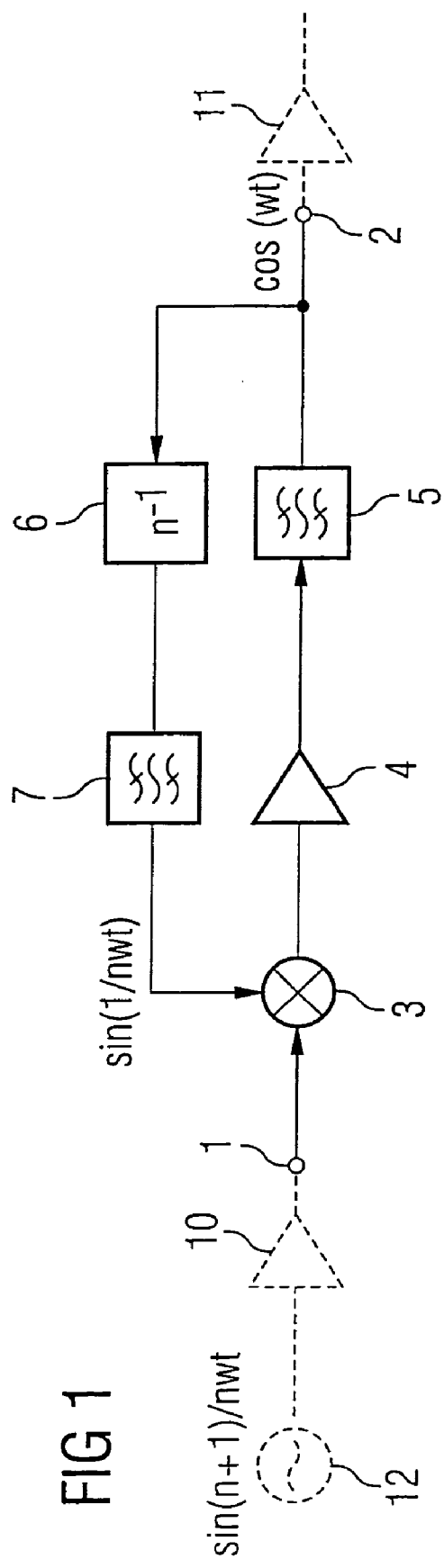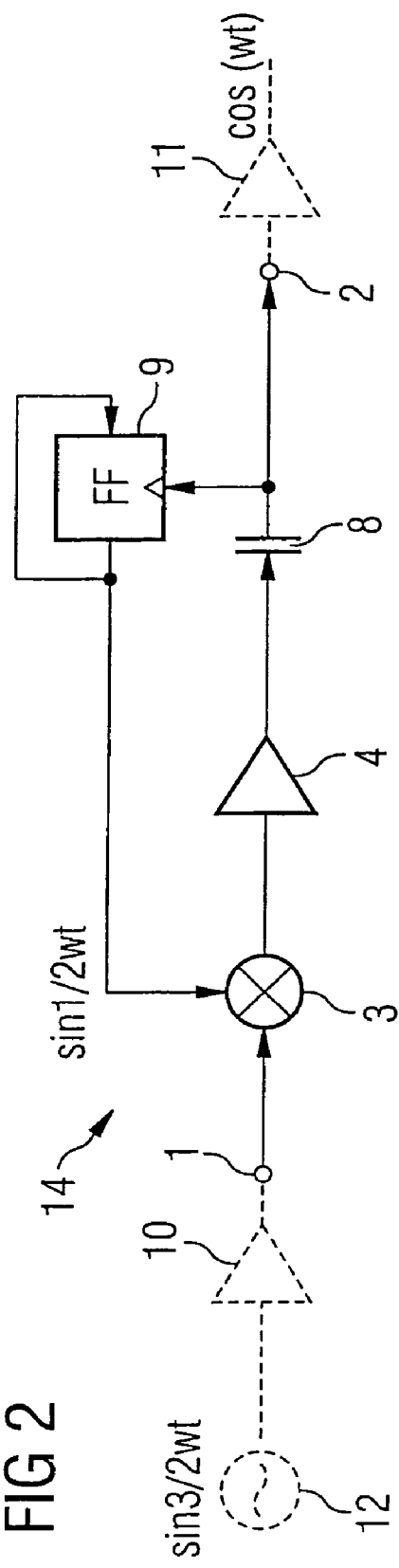

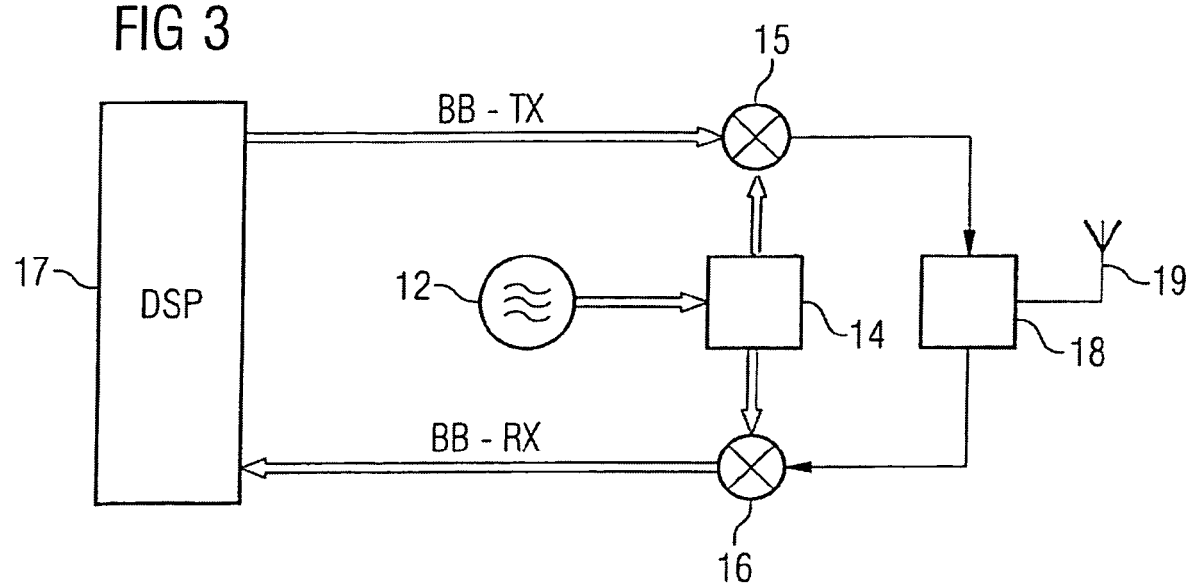

CIRCUIT ARRANGEMENT FOR FREQUENCY CONVERSION AND MOBILE RADIO DEVICE WITH THE CIRCUIT ARRANGEMENT

REFERENCE TO RELATED APPLICATIONS

This application is a continuation of PCT/DE03/00345, filed on Feb. 6, 2003, which was not published in English, that claims the benefit of the priority date of German Patent Application No. DE 102 10 708.4, filed on Mar. 12, 2002, the contents of which both are herein incorporated by reference in their entirety.

FIELD OF THE INVENTION

The present invention relates to a circuit arrangement for frequency conversion and to a mobile radio with the circuit arrangement.

BACKGROUND OF THE INVENTION

To convert transmitted and received signals from a baseband to a radio frequency or vice versa, radio-frequency mixers are normally used, which require a carrier signal for the frequency conversion. This carrier signal is normally provided by an oscillator, for example a voltage controlled oscillator. However, the oscillator normally does not oscillate at the carrier frequency which is required for the mixer but rather at a different frequency so that reactions by the transmission frequency on the oscillator are reduced. In this context, frequency conversion for the oscillator signal requires attention to be paid to low power consumption and low phase noise in the frequency converter.

The frequency conversion from the oscillator frequency to the carrier frequency that is required for the actual useful-signal frequency converter is effected, by way of example, by the oscillator frequency being mixed, in a frequency mixer, with itself, possibly after phase shifting, or with a signal that has been derived therefrom, divided down and filtered. The oscillator frequency can be divided down using integer division ratios. Filtering the oscillator signal which has already been divided down serves to avoid unwanted signal components at the output of the mixer, that might arise as a result of the mixing of relatively high harmonics. In this case, depending on the design pursued for the transmitter or receiver, the image frequency arising in the mixer for conditioning the oscillator signal may be extinguished as a result of the mixer having been produced using an architecture which suppresses the image frequency. However, this suppression is greatly dependent on the pairing tolerances in the frequency mixer, which in turn make high demands on production tolerances and also result in relatively high power consumption, poor phase noise properties and a large area requirement for the frequency converter, which is complex to produce overall.

The document DE 19710490 A1 specifies a frequency conversion circuit which comprises two frequency mixers. The first frequency mixer multiplies an input signal by a local oscillator signal, and the local oscillator signal is supplied to the second frequency mixer, which is connected downstream of the first, after frequency division.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a circuit arrangement for frequency conversion and a mobile radio with the circuit arrangement that allows frequency conversion with lower power consumption in the circuit and a smaller required chip area.

According to one aspect of the present invention, the circuit arrangement comprises an input for supplying an input signal at an input frequency, and an output configured to tap off an output signal thereat having an output frequency that is dependent on the input frequency. The arrangement further comprises a frequency mixer having a first input, which is connected to the input of the circuit arrangement, having a second input and having an output that is coupled to the output of the circuit arrangement. Lastly, the arrangement includes a frequency divider having an input that is connected to the output of the circuit arrangement, and having an output that is coupled to the second input of the frequency mixer. The frequency divider is configured to supply a signal at a divided-down output frequency.

In line with the present invention, a frequency mixer is used for frequency conversion for an input signal. This frequency mixer does not mix the input frequency with itself, possibly after phase shifting, or with a frequency derived therefrom through frequency division.

Rather, a feedback path is formed that contains a frequency divider which is coupled to a further input on the frequency mixer. Accordingly, the frequency mixer mixes the input signal, which is at the input frequency, with a signal derived from the output signal at the output frequency. This signal is provided by subjecting the output signal to frequency division.

The present invention has the advantage that relatively high harmonics in the divided-down output signal are brought down to the common mode in the mixer. The mixer may then have a simple filter connected downstream thereof that attenuates the remaining, unwanted signals.

Overall, the present invention facilitates the use of a frequency mixer for frequency conversion of the oscillator signal on which much lower linearity demands need to be made. For this reason, the mixer can be designed to be low power. Since the image frequency that arises is far enough away from the transmission frequency, that is to say from the output frequency of the circuit arrangement, the image frequency can be attenuated using a simple filter.

A particular advantage in terms of power consumption and required chip area is found in designing the frequency divider to have the division factor two. That is to say, the frequency divider supplies a signal at half the output frequency to the second input of the frequency mixer.

In this case, the output of the frequency mixer provides a signal at a frequency that is obtained from the difference between the input frequency and half the output frequency. The image frequency, which is to be suppressed, is in this case obtained from the sum of the input frequency, that is to say normally the oscillator frequency, and half the output frequency of the circuit arrangement. In the case of frequency division with the integer division value n=2 in the frequency feedback loop, the power consumption and the necessary chip area are halved as compared with the frequency conversion circuits mentioned at the outset.

One particularly advantageous embodiment of the present circuit arrangement is obtained by producing the frequency divider with a flip-flop. In this case, the clock input of the flip-flop is preferably connected to the output of the circuit arrangement for frequency conversion. A closed feedback path is preferably formed between the input and the output of the flip-flop. The output of the flip-flop is connected to the second input of the frequency mixer.

A further, advantageous embodiment of the present invention comprises, between the output of the frequency mixer and the input of the frequency divider, and hence also upstream of the output of the circuit arrangement, a means for DC component decoupling, that is, a component configured to DC decouple the output signal from the frequency mixer. This decoupling advantageously suppresses common-mode components that may arise as a result of mixing the divided-down output signal with the input signal.

The means for DC component decoupling comprises, in one example, a capacitor that is connected in series with the signal path.

For a mobile radio, a circuit arrangement as described above is included therein, and comprises at least one device for frequency conversion of a useful signal between a radio frequency and a baseband, having an auxiliary input for supplying a signal at a carrier frequency. The mobile radio further comprises a frequency generator that provides, at an output, a reference signal at a reference frequency. The frequency conversion device has an input that is coupled to the output of the frequency generator and an output that is coupled to the auxiliary input thereof.

The circuit arrangement for frequency conversion, as described above, is used to convert the reference frequency provided by an oscillator into a signal at another frequency so that any reaction by the transmitted signal on a frequency generator is as small as possible. This signal is used to feed a device for frequency conversion for a useful signal at an auxiliary input, said device being designed either to convert a baseband signal into a radio frequency or vice versa.

Instead of the described actuation of a useful-signal frequency converter, which prompts direct conversion between a radio frequency and baseband or vice versa, a frequency conversion circuit based on the present invention may advantageously also be used, within the scope of the invention, in heterodyne transceiver architectures or in pure transmission or reception architectures.

BRIEF DESCRIPTION OF THE DRAWINGS

The invention is explained in more detail below using a plurality of exemplary embodiments with reference to the drawings, in which:

FIG. 1 shows a first exemplary embodiment of the present invention using a simplified block diagram with an N frequency divider, FIG. 2 shows a further embodiment of the present invention using a block diagram with a divide-by-two frequency division, and FIG. 3 shows a mobile radio with a circuit arrangement for frequency conversion as shown in FIG. 1 or 2.

DETAILED DESCRIPTION OF THE INVENTION

FIG. 1 shows a circuit arrangement for frequency conversion having an input 1 for supplying an input signal at an input frequency, having an output 2 at which it is possible to tap off an output signal at an output frequency that is dependent on the input frequency, and having a frequency mixer 3. The frequency mixer 3 is designed to have a first input, which is connected to the input 1 of the conversion circuit, a further input and an output. The output of the frequency mixer 3 is connected to the output 2 of the circuit arrangement via an amplifier 4 and a bandpass filter 5. In addition, a feedback path from the output 2 of the circuit to the further input of the frequency mixer 3 is provided which comprises a frequency divider 6 with a bandpass filter 7 downstream. In this arrangement, the input of the frequency divider 6 is connected to the output of the circuit 2, while the output of the filter 7 is connected to the further input of the mixer 3.

A voltage controlled oscillator 12 is connected to the input 1 of the circuit arrangement via an optional amplifier 10. Similarly, the output 2 has a further amplifier 11 connected to it, which is intended to represent a further signal processing chain. The oscillator 12 provides a sinusoidal, radio-frequency signal at the angular frequency $[(N+1)/N]*\omega$. This signal is converted into a cosinusoidal, radio-frequency signal at the angular frequency $\omega$ in the frequency mixer 3. For this purpose, the frequency divider 6, which divides the output signal using the frequency divider N, provides a sinusoidal signal at the angular frequency $(1/N)\omega$ at the further input of the mixer 3.

On account of the low linearity demands on the mixer 3, the present invention permits particularly low power frequency conversion. For this reason, the frequency conversion circuit shown in FIG. 1 is particularly suitable for operation in mobile radios and, in this application, for providing a carrier frequency or local oscillator frequency.

FIG. 2 shows a development of the circuit arrangement from FIG. 1 whose design and manner of operation largely correspond to those in FIG. 1 and therefore do not need to be described again at this point. Only the divide-by-N frequency divider 6 has been replaced with a divide-by-two frequency divider 9, whose output provides a signal applied to its input at half the clock frequency. In addition, the bandpass filter 7 in the feedback path in the circuit 14 for frequency conversion shown in FIG. 2 has been replaced with a short circuit. Finally, the bandpass filter 5 in the forward path has been replaced with a series capacitor 8. The capacitor 8 connects the output of the amplifier 4 to the output 2 of the circuit arrangement. The divide-by-two frequency divider 9 is in the form of a flip-flop which comprises a clock input, a data input and a data output. The output 2 of the circuit arrangement is connected to the clock input of the frequency divider 9. The data input and data output of the flip-flop are shorted together in a further feedback loop. The output of the flip-flop is connected to the further input of the mixer 3.

In the circuit arrangement shown in FIG. 2, the oscillator 12 provides an input frequency which is represented by the angular frequency $(3/2)\omega$. The oscillator signal has a sinusoidal waveform. At the output 2 of the circuit, the mixer 3 provides an output signal at the angular frequency $\omega$. This is achieved by virtue of the divide-by-two frequency divider 9 dividing the signal at the angular frequency $\omega$ to produce a sinusoidal signal at the angular frequency $\omega/2$, which is mixed with the oscillator signal frequency $(3/2)\omega$. The image frequency, which is obtained from the sum of the input frequencies and is $2\omega$, is far enough away from the transmission frequency in order to be able to be attenuated by a simple filter. The harmonics in the divided-down output signal are brought down at least in part to the common mode in the mixer 3 and are easily decoupled from the output 2 using the capacitor 8.

In comparison with previously known frequency conversion circuits, the present embodiment with a frequency division ratio of two achieves halved power consumption and a halving of the necessary chip area.

Finally, FIG. 3 shows the application of the frequency conversion circuit from FIG. 2 in a mobile radio transceiver. In this case, a step-up frequency mixer 15 is provided in a transmission path and a step-down frequency mixer 16 is provided in a reception path in the mobile radio. The step-up frequency converter 15 has a modulation input for supplying a modulation signal BB-TX present in the baseband and is coupled to a digital signal processor 17 which provides the modulation signal in the baseband. The output of the step-up frequency converter 15 provides the modulation signal as a modulated carrier converted into a radio frequency. The output of the step-up frequency mixer 15 is coupled to a duplex unit 18 which is in turn connected bi-directionally to an antenna 19.

In addition, in the reception direction, an output on the duplex unit 18 is connected to a radio-frequency input on the step-down frequency mixer 16 in order to supply a radio-frequency received signal. The output of the step-down frequency mixer 16 is connected to an input on the digital signal processor 17, which is supplied in the process with a demodulated received signal BB-RX converted down to baseband. To drive the frequency mixer 15, 16 with a carrier signal, a voltage controlled oscillator 12, which may also comprise a phase locked loop, is provided. This voltage controlled oscillator 12 is connected to a respective auxiliary input on the mixers 15, 16 via the circuit arrangement for frequency conversion 14. Accordingly, the oscillation frequency of the oscillator 12 is supplied to the auxiliary inputs of the mixers 15, 16 after conditioning.

Particularly in mobile applications, the properties of the present frequency conversion circuit, such as low power consumption and small chip area, are of particular significance. The oscillator 12 can operate at half the oscillation frequency, which means that further simplification of the circuit layout is ensured.

Instead of the direct conversion architecture shown for the mobile radio, particularly in relation to the reception path in the transceiver shown in FIG. 3, heterodyne architectures and low-IF architectures may also advantageously be equipped with the inventive frequency conversion circuit.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. A frequency conversion circuit, comprising:
an input configured to supply an input signal at an input frequency;
an output configured to supply an output signal at an output frequency that is dependent on the input frequency;
a frequency mixer comprising a first input connected to the input of the frequency conversion circuit, a second input, and an output that is coupled to the output of the frequency conversion circuit; and
a frequency divider arranged in a feedback path of the frequency conversion circuit, and configured to output a signal at a frequency divided down from the output frequency, the frequency divider comprising an input connected to the output of the frequency conversion circuit, and an output coupled to the second input of the frequency mixer such that the input frequency is (N+1)/N times the output frequency, where N is the division factor of the frequency divider.

2. The circuit of claim 1, wherein the frequency divider comprises a divide-by-two frequency divider.

3. The circuit of claim 1, wherein the frequency divider comprises a flip-flop.

4. The circuit of claim 3, wherein the flip-flop comprises a clock input that forms the input of the frequency divider.

5. The circuit of claim 1, further comprising a means for DC component decoupling coupled between the output of the frequency mixer and the input of the frequency divider, and operable to decouple the output signal from the circuit arrangement.

6. The circuit of claim 5, wherein the means for DC component decoupling comprises a capacitor.

7. A mobile radio system, comprising:
at least one mixer configured to frequency convert a useful signal between a radio frequency and a baseband, and comprising an auxiliary input for receiving a signal at a carrier frequency;
a frequency generator configured to generate a reference signal at a reference frequency at an output thereof; and
a frequency conversion circuit having an input coupled to the output of the frequency generator and an output coupled to the auxiliary input of the at least one mixer, wherein the frequency conversion circuit is configured to receive the reference signal having the reference frequency and output to the auxiliary input of the at least one mixer the signal at the auxiliary carrier frequency that is dependent on the reference frequency, wherein the frequency conversion circuit comprises:
an input configured to supply an input signal at an input frequency;
an output configured to supply an output signal at an output frequency that is dependent on the input frequency;
a frequency mixer comprising a first input connected to the input of the frequency conversion circuit, a second input, and an output that is coupled to the output of the frequency conversion circuit; and
a frequency divider arranged in a feedback path of the frequency conversion circuit, and configured to output a signal at a frequency divided down from the output frequency, the frequency divider comprising an input connected to the output of the frequency conversion circuit, and an output coupled to the second input of the frequency mixer.

8. A frequency conversion circuit operable to convert an input signal having an oscillator frequency to an output signal having a carrier frequency different than the oscillator frequency, comprising:
   an input and an output;
   a frequency mixer having a first input coupled to the input of the frequency conversion circuit, having a second input, and having an output coupled to the output of the frequency conversion circuit; and
   a frequency divider having an input coupled to the output of the frequency conversion circuit, and having an output coupled to the second input of the frequency mixer,
   wherein the frequency divider is configured to divide down a frequency of the output signal, and wherein the frequency mixer is configured to mix the divided down output signal with the input signal, thereby producing the output signal having the carrier frequency.

9. The frequency conversion circuit of claim 8, further comprising a first bandpass filter coupled between the output of the frequency mixer and the output of the frequency conversion circuit.

10. The frequency conversion circuit of claim 9, wherein the input of the frequency divider is coupled to the output of the first bandpass filter.

11. The frequency conversion circuit of claim 9, further comprising an amplifier coupled between the output of the frequency mixer and an input of the first bandpass filter.

12. The frequency conversion circuit of claim 8, wherein the frequency divider comprises a flip-flop circuit configured as a divide-by-two frequency divider.

13. The frequency conversion circuit of claim 12, wherein an output the frequency conversion circuit is coupled to a clock input of the flip-flop circuit, and a data output of the flip-flop circuit is coupled to a data input thereof and to a second input of the frequency mixer.

14. The frequency conversion circuit of claim 12, further comprising a DC decoupling circuit coupled between the output of the frequency mixer and an input of the flip-flop circuit.

15. The frequency conversion circuit of claim 14, wherein the DC decoupling circuit comprises a capacitor.

16. The frequency conversion circuit of claim 8, further comprising a DC decoupling circuit coupled between the output of the frequency mixer and an input of the flip-flop circuit.

17. The frequency conversion circuit of claim 16, wherein the DC decoupling circuit comprises a capacitor.

* * * * *